United States Patent
Yu et al.

(10) Patent No.: US 11,657,599 B2
(45) Date of Patent: May 23, 2023

(54) METHOD FOR DETECTING APPEARANCE OF SIX SIDES OF CHIP MULTI-LAYER CERAMIC CAPACITOR BASED ON ARTIFICIAL INTELLIGENCE

(71) Applicant: Zhuhai Autovision Technology Co. Ltd., Zhuhai (CN)

(72) Inventors: Chaofan Yu, Guangdong (CN); Bo Gong, Guangdong (CN); Sheng Zeng, Guangdong (CN); Liping Zhu, Guangdong (CN); Guangjin Ye, Guangdong (CN)

(73) Assignee: ZHUHAI AUTOVISION TECHNOLOGY CO. LTD., Zhuhai (CN)

( * ) Notice: Subject to any disclaimer, the term of this patent is extended or adjusted under 35 U.S.C. 154(b) by 512 days.

(21) Appl. No.: 16/851,120

(22) Filed: Apr. 17, 2020

(65) Prior Publication Data

US 2020/0240924 A1 Jul. 30, 2020

(30) Foreign Application Priority Data

Mar. 18, 2020 (CN) .......................... 202010192560.7

(51) Int. Cl.
| | |
|---|---|
| G06T 7/00 | (2017.01) |
| G06F 7/70 | (2006.01) |
| G06V 10/774 | (2022.01) |
| G06N 5/00 | (2023.01) |
| G06V 10/44 | (2022.01) |
| G06V 10/74 | (2022.01) |

(52) U.S. Cl.
CPC ............. *G06V 10/774* (2022.01); *G06N 5/00* (2013.01); *G06V 10/44* (2022.01); *G06V 10/74* (2022.01)

(58) Field of Classification Search
None
See application file for complete search history.

(56) References Cited

FOREIGN PATENT DOCUMENTS

KR 1020210112671 * 9/2021 ............. H01G 13/00

OTHER PUBLICATIONS

Haikuracy ("Component Inspection & Sorting System", https://www.haikutech.com/products/inspectionandsingulation/componentinspectionandsortingsystem archived by The Wayback Machine on Dec. 14, 2018 (Year: 2018).*

Tseng et al. "Image Inspection System for Defect Detection of Multilayer Ceramic Capacitors", Proceedings of the 2006 International Conference on Intelligent Information Hiding and Multimedia Signal Processing (Year: 2006).*

* cited by examiner

*Primary Examiner* — Randolph I Chu

(57) ABSTRACT

The present invention relates to the technical field of detection of the appearance of electronic components, and in particular to a method for detecting the appearance of six sides of a chip multi-layer ceramic capacitor based on artificial intelligence. In the method for detecting the appearance of six sides of a chip multi-layer ceramic capacitor based on artificial intelligence as provided by the present invention, a picture is automatically divided, by AI, into regions which are then classified, and extracted features are judged by conventional algorithms. It is more flexible to deal with various defects. Defect missing is avoided, and the false rate is reduced.

9 Claims, 1 Drawing Sheet

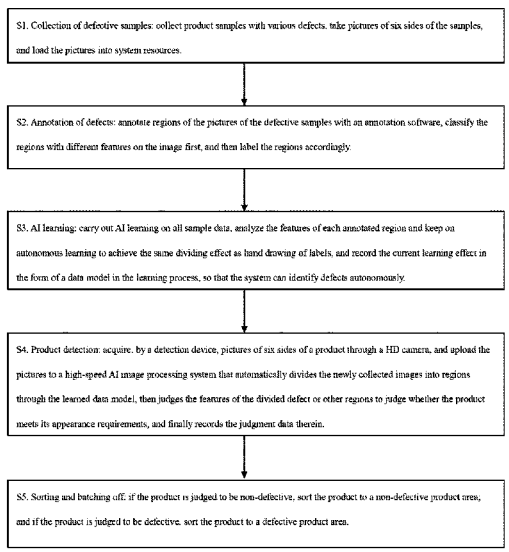

S1. Collection of defective samples: collect product samples with various defects, take pictures of six sides of the samples, and load the pictures into system resources.

↓

S2. Annotation of defects: annotate regions of the pictures of the defective samples with an annotation software, classify the regions with different features on the image first, and then label the regions accordingly.

↓

S3. AI learning: carry out AI learning on all sample data, analyze the features of each annotated region and keep on autonomous learning to achieve the same dividing effect as hand drawing of labels, and record the current learning effect in the form of a data model in the learning process, so that the system can identify defects autonomously.

↓

S4. Product detection: acquire, by a detection device, pictures of six sides of a product through a HD camera, and upload the pictures to a high-speed AI image processing system that automatically divides the newly collected images into regions through the learned data model, then judges the features of the divided defect or other regions to judge whether the product meets its appearance requirements, and finally records the judgment data therein.

↓

S5. Sorting and batching off: if the product is judged to be non-defective, sort the product to a non-defective product area; and if the product is judged to be defective, sort the product to a defective product area.

METHOD FOR DETECTING APPEARANCE OF SIX SIDES OF CHIP MULTI-LAYER CERAMIC CAPACITOR BASED ON ARTIFICIAL INTELLIGENCE

BACKGROUND OF THE INVENTION

The present invention relates to the technical field of detection of the appearance of electronic components, and in particular to a method for detecting the appearance of six sides of a chip multi-layer ceramic capacitor based on artificial intelligence.

In order to meet the continuous development of electronic devices towards miniaturization, large capacity, high reliability and low cost, multi-layer ceramic capacitors have also been developing rapidly, which is indicated by the increasing variety, decreasing size, improving performance, the continuous improvement of technology, the continuous update of materials, and the trend of standardization and generalization of lightweight, thin, short and small series products. The application thereof to consumer equipment has gradually penetrated and developed into that to investment equipment, especially to mobile communication equipment that uses a large number of chip components, and a small capacitor can directly affect the stability of electronic products.

The multi-layer ceramic capacitor manufacturers can produce billions of products every day. The quality requirements on electronic products are getting higher and higher, and it is even required that all sides of each component be subject to appearance inspection. Furthermore, the visual inspection method using traditional machines has the following disadvantages:

1. It is difficult to analyze the defect of low background contrast, resulting in a high defect missing rate.

2. There are high requirements on debugging personnel who are supposed to master basic knowledge and special know-how of image processing. With the departure of experienced personnel, the equipment may not operate normally.

3. Some defects (such as scratches, hidden cracks) of ceramic capacitors are sensitive to position, direction, illumination and other variables, resulting in a high false rate easily.

BRIEF SUMMARY OF THE INVENTION

In order to solve the above problems, the present invention provides a method for detecting the appearance of six sides of a chip multi-layer ceramic capacitor based on artificial intelligence, which can improve detection accuracy, reduce the dependence on human experience, and make detection devices intelligent.

To achieve the above objective, a technical solution employed in the present invention is as follows: a method for detecting the appearance of six sides of a chip multi-layer ceramic capacitor based on artificial intelligence is provided, including the following detecting steps of:

S1. collection of defective samples: collecting product samples with various defects, taking pictures of six sides of the samples, and loading the pictures into system resources;

S2. annotation of defects: annotating regions of the pictures of the defective samples with an annotation software, classifying the regions with different features on the image first, and then labeling the regions accordingly;

S3. AI learning: carrying out AI learning on all sample data, analyzing the features of each annotated region and keeping on autonomous learning to achieve the same dividing effect as hand drawing of labels, and recording the current learning effect in the form of a data model in the learning process, so that the system can identify defects autonomously in a later period;

S4. product detection: acquiring, by a detection device, pictures of six sides of a product through a HD camera, and uploading the pictures to a high-speed AI image processing system that automatically divides the newly collected images into regions through the learned data model, then judges the features of the divided defect or other regions to judge whether the product meets its appearance requirements, and finally records the judgment data therein; and S5. sorting and batching off: if the product is judged to be non-defective, sorting the product to a non-defective product area; and if the product is judged to be defective, sorting the product to a defective product area.

During the collection of defective samples in S1, it is necessary to classify the defective samples, put different samples with the same defects in a same annotation list, and distinguish the samples in the annotation list with different serial numbers.

Further, annotation of defects in S2 includes the following steps of:

1) collecting defect types and detection demands from customers, and planning classification methods;

2) manually annotating the regions, and dividing the regions according to the pixel level, wherein the divided regions are combined to form a whole product under detection. Generally, AI only annotates defects. In order to realize a pixel-level defect detection and reduce the false rate, the method as provided by the present invention divides and annotates a product image according to global pixels, and combine the divided images again through algorithms, so that the accuracy can be improved to more than 99% even for contrast defects that are difficult to detect by traditional algorithms.

3) drawing regions with complex shapes by automatic label extraction; and 4) storing the annotated regions to corresponding classification labels.

Further, the AI learning in S3 includes the following processes of:

1) performing enhancement processing on the images of the defective sample;

2) acquiring the area, length, width, pixel ratio, pixel texture distribution and gradation of the image in each individual region, and aggregating the above features into a set as a feature set vector;

3) training each feature according to the feature set vector to determine model parameters;

4) establishing corresponding defect image models according to the model parameters; and 5) storing the established image models in a system database.

The system database includes a plurality of sub-databases, and the image models of different defective samples are stored in different sub-databases for classification.

Further, when carrying out AI learning in S3, it is necessary to carry out superposition learning on the samples with the same defects, and carry out learning feedback training till the detection accuracy in the feedback training reaches more than 99%. Other defective samples may be added in the learning process at the same time for AI learning.

Further, the learning process includes a step of comparing the original picture taken, the annotated image and the learned image. The learned image obtained after each learning is more similar to a standard image, and the repeated learning may not be stopped until the similarity between the learned image and the annotated image reaches more than 99%, thus obtaining a high-speed AI model.

In the feedback training, the samples of which the defects are detected by the system after AI learning are compared with pictures of other samples with the same defects, till the accuracy of the detection results reaches more than 99%.

Further, the product detection in S4 includes the following processes of:

1) taking pictures of six sides of a product;

2) calling a corresponding high-speed AI model for the image of each side, and extracting regions of interest (ROI) from individual regions by quadratic dynamic extraction;

3) encapsulating the regions of interest (ROI) at one time and sending the same to a CUDA core of GPU for real-time high-speed AI parallel computation to realize region division; and 4) comparing, by the system, pixel-level (the highest accuracy: 3 microns/pixel) features (such as size, direction and gradation, etc.) of an object divided that are extracted through AI parallel computation with specifications in the database to identify and judge whether the product has defects; if there are regions beyond the given specifications, judging the product to be defective; and if all region features meet the specifications, judging the product to be non-defective.

The system will also count the products during product detection in S4. If the system judges a product to be non-defective, it will increase the reading of a counter corresponding to the non-defective product by 1. If the system judges a product to be defective, it will increase the reading of a counter corresponding to the defective product by 1 according to the defect type of the product.

The invention has the beneficial effects that:

1. In the method for detecting the appearance of six sides of a chip multi-layer ceramic capacitor based on artificial intelligence as provided by the present invention, a picture is automatically divided, by AI, into regions which are then classified, and extracted features are judged by conventional algorithms. It is more flexible to deal with various defects.

2. Defect missing is avoided, and the false rate is reduced by continuously adding sample data to expand the learning data volume, increasing the learning time, and constantly improving the accuracy of defect identification.

3. The data model can be constantly improved by verifying the learning effect with newly collected images and adding images with poor learning effect to the feedback training data, so that the detection accuracy can be infinitely close to 100%.

BRIEF DESCRIPTION OF THE DRAWINGS

FIG. 1 is a flow block diagram of this embodiment.

DETAILED DESCRIPTION OF THE INVENTION

The present invention will be further described in detail as below with reference to the accompanying drawings by the specific embodiments. The present application may be implemented in many different forms and is not limited to the embodiments described herein. The following specific embodiments are provided for the purpose of facilitating a clearer and more thorough understanding of the disclosure in the present application.

Referring to FIG. 1, the present invention relates to a method for detecting the appearance of six sides of a chip multi-layer ceramic capacitor based on artificial intelligence, including the following detecting steps of:

S1. collection of defective samples: collecting product samples with various defects, taking pictures of six sides of the samples, and loading the pictures into system resources;

S2. annotation of defects: annotating regions of the pictures of the defective samples with an annotation software, classifying the regions with different features on the image first, and then labeling the regions accordingly;

S3. AI learning: carrying out AI learning on all sample data, analyzing the features of each annotated region and keeping on autonomous learning to achieve the same dividing effect as hand drawing of labels, and recording the current learning effect in the form of a data model in the learning process, so that the system can identify defects autonomously in a later period;

S4. product detection: acquiring, by a detection device, pictures of six sides of a product through a HD camera, and uploading the pictures to a high-speed AI image processing system that automatically divides the newly collected images into regions through the learned data model, then judges the features of the divided defect or other regions to judge whether the product meets its appearance requirements, and finally records the judgment data therein; and S5. sorting and batching off: if the product is judged to be non-defective, sorting the product to a non-defective product area; and if the product is judged to be defective, sorting the product to a defective product area.

In this embodiment, annotation of defects in S2 includes the following steps of:

1) collecting defect types and detection demands from customers, and planning classification methods;

2) manually annotating the regions, and dividing the regions according to the pixel level, wherein the divided regions are combined to form a whole product under detection. Generally, AI only annotates defects. In order to realize a pixel-level defect detection and reduce false rate, the method provided by the present invention divides and annotates a product image according to global pixels, and combine the divided images again through algorithms, so that the accuracy can be improved to more than 99%.

3) drawing regions with complex shapes by automatic label extraction; and 4) storing the annotated regions to corresponding classification labels.

In this embodiment, the annotation list of defective samples includes damaged element edge, chipped element, solder on porcelain body, damaged porcelain body, brightness of porcelain body, dirty marks, cracks and potholes/foreign matters on porcelain body, electrode size, two different terminals, endotaxy electrode, tin-coating/endotaxy porcelain body, scratches and bulges on electrode, inner edge deformation of electrode, foreign matters and dark spots on electrode, electrode oxidation, pitted electrode, electrode missing, damaged electrode, short-circuited electrode, dark spots on terminals, broken/deformed and damaged terminals. That is, in this embodiment, products with the above defects in the annotation list can be detected, and the user may add other defects in the list for learning and identification, thus enabling the system to identify new defects.

In this embodiment, the AI learning in S3 includes the following processes of:

1) performing enhancement processing on the images of the defective sample;

2) acquiring the area, length, width, pixel ratio, pixel texture distribution and gradation of the image in each individual region, and aggregating the above features into a set as a feature set vector;

3) training each feature according to the feature set vector to determine model parameters;

4) establishing corresponding defect image models according to the model parameters; and 5) storing the established image models in a system database.

The system database includes a plurality of sub-databases, and the image models of different defective samples are stored in different sub-databases for classification. In addition, before carrying out AI learning in S3, the original image of the picture taken can also be processed by fixed ROI acceleration or dynamic ROI screen capture, and cropped for AI learning.

In this embodiment, when carrying out AI learning in S3, it is necessary to carry out superposition learning on the samples with the same defects, and carry out learning feedback training till the detection accuracy in the feedback training reaches more than 99%. Moreover, other defective samples may be added in the learning process at the same time for AI learning. The learning process includes a step of comparing the original picture taken, the annotated image and the learned image. The learned image obtained after each learning is more similar to a standard image, and the repeated learning may not be stopped until the similarity between the learned image and the annotated image reaches more than 99%, thus obtaining a high-speed AI model.

In the feedback training, the samples of which the defects are detected by the system after AI learning are compared with pictures of other samples with the same defects, till the accuracy of the detection results reaches more than 99%. New samples may be loaded to verify the effect of the currently learned image model, and to check whether there are samples that have been misjudged or wrongly judged. If so, the samples with the above problem are used as learning resources, AI learning is carried out again, and the database is constantly improved, thus forming a system with extremely high accuracy and autonomous identification ability.

In this embodiment, the product detection in S4 includes the following processes of:

1) taking pictures of six sides of a product;

2) calling a corresponding high-speed AI model for the image of each side, and extracting regions of interest (ROI) from individual regions by quadratic dynamic extraction;

3) encapsulating the regions of interest (ROI) at one time and sending the same to a CUDA core of GPU for real-time high-speed AI parallel computation to realize region division; and 4) comparing, by the system, pixel-level (the highest accuracy: 3 microns/pixel) features (such as size, direction and gradation, etc.) of an object divided that are extracted through AI parallel computation with specifications in the database to identify and judge whether the product has defects; if there are regions beyond the given specifications, judging the product to be defective; and if all region features meet the specifications, judging the product to be non-defective.

When the system with autonomous identification ability is adopted to carry out the product detection in S4, it will also count the products. If the system judges a product to be non-defective, it will increase the reading of a counter corresponding to the non-defective product by 1. If the system judges a product to be defective, it will increase the reading of a counter corresponding to the defective product by 1 according to the defect type of the product, thus realizing statistics of the detected products and recording the quantity of the non-defective products and various defective products. Furthermore, during product detection in S4, the products under detection are irradiated by RGB LED light sources with extremely high homogeneity and brightness, so that the surface of the products is provided with enough brightness, the definition of the pictures taken is ensured, and the detection efficiency and effect are improved.

It should be further noted that the annotation software, AI learning software and image processing employed in this specific embodiment can be implemented using software of the prior art. Moreover, this specific embodiment needs to be used in combination with the corresponding appearance detection device to realize the entire appearance detection process.

The above embodiments merely describe the preferred embodiments of the present invention, and are not intended to limit the scope of the present invention. Without departing from the spirit of the present invention, various modifications and improvements made by a person of ordinary skill in the art to the technical solution of the present invention shall all fall within the protection scope defined by the claims of the present invention.

What is claimed is:

1. A method for detecting the appearance of six sides of a chip multi-layer ceramic capacitor based on artificial intelligence, characterized in that it comprises the following detecting steps of:

S1. collection of defective samples: collecting product samples with various defects, taking pictures of six sides of the samples, and loading the pictures into system resources;

S2. annotation of defects: annotating regions of the pictures of the defective samples with an annotation software, classifying the regions with different features on the image first, and then labeling the regions accordingly;

S3. AI learning: carrying out AI learning on all sample data, analyzing the features of each annotated region and keeping on autonomous learning to achieve the same dividing effect as hand drawing of labels, and recording the current learning effect in the form of a data model in the learning process, so that the system can identify defects autonomously;

S4. product detection: acquiring, by a detection device, pictures of six sides of a product through a HD camera, and uploading the pictures to a high-speed AI image processing system that automatically divides the newly collected images into regions through the learned data model, then judges the features of the divided defect or other regions to judge whether the product meets its appearance requirements, and finally records the judgment data therein; and S5. sorting and batching off: if the product is judged to be non-defective, sorting the product to a non-defective product area; and if the product is judged to be defective, sorting the product to a defective product area;

wherein during the collection of defective samples in S1, it is necessary to classify the defective samples, put different samples with the same defects in a same annotation list, and distinguish defect types in the annotation list with different serial numbers.

2. The method for detecting the appearance of six sides of a chip multi-layer ceramic capacitor based on artificial intelligence according to claim 1, wherein annotation of defects in S2 comprises the following steps of:

1) collecting defect types and detection demands from customers, and planning classification methods;
2) manually annotating the regions, and dividing the regions according to the pixel level, wherein the divided regions are combined to form a whole product under detection;
3) drawing regions with complex shapes by automatic label extraction; and
4) storing the annotated regions to corresponding classification labels.

3. The method for detecting the appearance of six sides of a chip multi-layer ceramic capacitor based on artificial intelligence according to claim 1, wherein the AI learning in S3 comprises the following processes of:
1) performing enhancement processing on the images of the defective sample;
2) acquiring the area, length, width, pixel ratio, pixel texture distribution and gradation of the image in each individual region, and aggregating the above features into a set as a feature set vector;
3) training each feature according to the feature set vector to determine model parameters;
4) establishing corresponding defect image models according to the model parameters; and
5) storing the established image models in a system database.

4. The method for detecting the appearance of six sides of a chip multi-layer ceramic capacitor based on artificial intelligence according to claim 3, wherein the system database includes a plurality of sub-databases, and the image models of different defective samples are stored in different sub-databases for classification.

5. A method for detecting the appearance of six sides of a chip multi-layer ceramic capacitor based on artificial intelligence, characterized in that it comprises the following detecting steps of:
S1. collection of defective samples: collecting product samples with various defects, taking pictures of six sides of the samples, and loading the pictures into system resources;
S2. annotation of defects: annotating regions of the pictures of the defective samples with an annotation software, classifying the regions with different features on the image first, and then labeling the regions accordingly;
S3. AI learning: carrying out AI learning on all sample data, analyzing the features of each annotated region and keeping on autonomous learning to achieve the same dividing effect as hand drawing of labels, and recording the current learning effect in the form of a data model in the learning process, so that the system can identify defects autonomously;
S4. product detection: acquiring, by a detection device, pictures of six sides of a product through a HD camera, and uploading the pictures to a high-speed AI image processing system that automatically divides the newly collected images into regions through the learned data model, then judges the features of the divided defect or other regions to judge whether the product meets its appearance requirements, and finally records the judgment data therein; and
S5. sorting and batching off: if the product is judged to be non-defective, sorting the product to a non-defective product area; and if the product is judged to be defective, sorting the product to a defective product area;
wherein when carrying out AI learning in S3, it is necessary to carry out superposition learning on the samples with the same defects, and carry out learning feedback training till the detection accuracy in the feedback training reaches more than 99%; and other defective samples can be added in the learning process at the same time for AI learning.

6. The method for detecting the appearance of six sides of a chip multi-layer ceramic capacitor based on artificial intelligence according to claim 5, wherein the learning process comprises a step of comparing the original picture taken, the annotated image and the learned image, the learned image obtained after each learning is more similar to a standard image; and the repeated learning may not be stopped until the similarity between the learned image and the annotated image reaches more than 99%, thus obtaining a high-speed AI model.

7. The method for detecting the appearance of six sides of a chip multi-layer ceramic capacitor based on artificial intelligence according to claim 5, wherein in the feedback training, the samples of which the defects are detected by the system after AI learning are compared with pictures of other samples with the same defects, till the accuracy of the detection results reaches more than 99%.

8. A method for detecting the appearance of six sides of a chip multi-layer ceramic capacitor based on artificial intelligence, characterized in that it comprises the following detecting steps of:
S1. collection of defective samples: collecting product samples with various defects, taking pictures of six sides of the samples, and loading the pictures into system resources;
S2. annotation of defects: annotating regions of the pictures of the defective samples with an annotation software, classifying the regions with different features on the image first, and then labeling the regions accordingly;
S3. AI learning: carrying out AI learning on all sample data, analyzing the features of each annotated region and keeping on autonomous learning to achieve the same dividing effect as hand drawing of labels, and recording the current learning effect in the form of a data model in the learning process, so that the system can identify defects autonomously;
S4. product detection: acquiring, by a detection device, pictures of six sides of a product through a HD camera, and uploading the pictures to a high-speed AI image processing system that automatically divides the newly collected images into regions through the learned data model, then judges the features of the divided defect or other regions to judge whether the product meets its appearance requirements, and finally records the judgment data therein; and
S5. sorting and batching off: if the product is judged to be non-defective, sorting the product to a non-defective product area; and if the product is judged to be defective, sorting the product to a defective product area;
wherein the product detection in S4 comprises the following processes of:
1) taking pictures of six sides of a product;
2) calling a corresponding high-speed AI model to classify regions of the image of each side, and extracting regions of interest from individual regions by quadratic dynamic extraction;
3) encapsulating the regions of interest at one time and sending the same to a CUDA core of GPU for real-time high-speed AI parallel computation; and
4) comparing, by the system, pixel-level features of an object divided that are extracted through AI parallel computation with specifications in the database to identify and judge whether the product has defects; if there are regions beyond the given specifications, judging the product to be defective; and if all region features meet the specifications, judging the product to be non-defective.

9. The method for detecting the appearance of six sides of a chip multi-layer ceramic capacitor based on artificial intelligence according to claim 8, wherein the system will also count the products during product detection in S4; if the system judges a product to be non-defective, it will increase the reading of a counter corresponding to the non-defective product by 1; and if the system judges a product to be defective, it will increase the reading of a counter corresponding to the defective product by 1 according to the defect type of the product.

* * * * *